United States Patent
Lv et al.

(10) Patent No.: US 9,721,999 B2
(45) Date of Patent: Aug. 1, 2017

(54) PIXEL ELEMENT STRUCTURE, ARRAY STRUCTURE AND DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Boyan Lv, Shanghai (CN); Liyuan Luo, Shanghai (CN); Dong Qian, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/538,759

(22) Filed: Nov. 11, 2014

(65) Prior Publication Data
US 2016/0027850 A1 Jan. 28, 2016

(30) Foreign Application Priority Data
Jul. 28, 2014 (CN) .......................... 2014 1 0363922

(51) Int. Cl.
H01L 27/32 (2006.01)
(52) U.S. Cl.
CPC ........ H01L 27/3218 (2013.01); H01L 27/326 (2013.01)
(58) Field of Classification Search
CPC ...................................................... H01L 51/56
See application file for complete search history.

(56) References Cited

U.S. PATENT DOCUMENTS

| 5,467,206 A * | 11/1995 | Loiseaux et al. ................. 349/5 |
| 2005/0225233 A1 | 10/2005 | Boroson et al. |
| 2006/0001362 A1 * | 1/2006 | Han et al. ..................... 313/504 |
| 2007/0152578 A1 | 7/2007 | Hung et al. |
| 2008/0218071 A1 * | 9/2008 | Kobayashi ................... 313/506 |
| 2009/0135108 A1 * | 5/2009 | Lindfors .............. G09G 3/3426 345/76 |
| 2011/0215329 A1 * | 9/2011 | Chung .................... H01L 51/52 257/59 |
| 2011/0272675 A1 | 11/2011 | Chung et al. |
| 2012/0075278 A1 * | 3/2012 | Hara .................... G09G 3/3208 345/211 |
| 2012/0153286 A1 * | 6/2012 | Yoon et al. ..................... 257/59 |

(Continued)

FOREIGN PATENT DOCUMENTS

| CN | 101262725 A | 9/2008 |
| CN | 103165642 A | 6/2013 |

*Primary Examiner* — Caridad Everhart
*Assistant Examiner* — Ankush Singal
(74) *Attorney, Agent, or Firm* — Anova Law Group, PLLC

(57) ABSTRACT

A pixel element structure is disclosed. The pixel element structure includes first, second, and third sub-pixel elements, each including a light-emitting region. At least one of the first, second, and third sub-pixel elements includes a light-transmitting region, where the light-emitting region includes an organic light-emitting diode light-emitting structure, and where the organic light-emitting diode light-emitting structure includes a first substrate, and a nontransparent anode, a pixel defining layer, an organic layer and a cathode, sequentially arranged above the first substrate.

19 Claims, 10 Drawing Sheets

(56) References Cited

U.S. PATENT DOCUMENTS

| | | | |
|---|---|---|---|
| 2012/0268696 A1* | 10/2012 | Yim | G09G 3/32 349/104 |
| 2013/0147851 A1* | 6/2013 | Yim | H01L 27/32 345/690 |
| 2013/0285034 A1* | 10/2013 | Akamatsu et al. | 257/40 |
| 2014/0014985 A1* | 1/2014 | Sonoda et al. | 257/89 |
| 2014/0145156 A1* | 5/2014 | Choi et al. | 257/40 |
| 2014/0183472 A1* | 7/2014 | Kim | H01L 27/3258 257/40 |
| 2014/0183479 A1* | 7/2014 | Park | H01L 51/56 257/40 |
| 2014/0184577 A1* | 7/2014 | Kim | G09G 5/10 345/207 |
| 2014/0284569 A1* | 9/2014 | Kwak et al. | 257/40 |
| 2014/0346469 A1* | 11/2014 | Shin et al. | 257/40 |
| 2015/0008820 A1* | 1/2015 | Lee | 313/504 |
| 2015/0029235 A1* | 1/2015 | Sato | 345/690 |
| 2015/0090985 A1* | 4/2015 | Park et al. | 257/40 |
| 2015/0102306 A1* | 4/2015 | Shi | H01L 27/3248 257/40 |
| 2015/0124199 A1* | 5/2015 | Su | G02F 1/133603 349/69 |
| 2015/0162387 A1* | 6/2015 | Gu et al. | |

\* cited by examiner

| Semitransparent cathode |
|---|
| Electronic injection layer |
| Electronic transmission layer |
| Organic light-emitting material layer |
| Hole transmission layer |
| Hole injection layer |
| Transparent anode |
| Glass substrate |

PIXEL ELEMENT STRUCTURE, ARRAY STRUCTURE AND DISPLAY DEVICE

CROSS-REFERENCES TO RELATED APPLICATIONS

This application claims the benefit of priority to Chinese Patent Application No. 201410363922.9, filed with the Chinese Patent Office on Jul. 28, 2014 and entitled "PIXEL ELEMENT STRUCTURE, ARRAY STRUCTURE AND DISPLAY DEVICE", the content of which is incorporated herein by reference in its entirety.

BACKGROUND

Compared with liquid crystal display devices and plasma display devices widely applied at present, Organic Light-Emitting Diode (OLED) display devices have earned increasing attention due to their self-illuminating, diversity of colors, high response speed, wide angle of view, light weight, low thickness, low power consumption, flexible display capability and other advantages.

Typically an OLED display device is consisted of a glass substrate, an Indium Tin Oxide (ITO) anode, an organic layer (including an organic light-emitting material layer), a semitransparent cathode and other components, wherein when voltage is applied to the anode, holes of the anode and electrons of the cathode are combined at the organic light-emitting material layer to excite the organic material in the organic light-emitting material layer to emit light. The OLED display device can generally fall into the two categories of a Below-Emitting OLED (BEOLED) display device and a Top-Emitting OLED (TEOLED) display device.

SUMMARY

One inventive aspect is a pixel element structure. The pixel element structure includes first, second, and third sub-pixel elements, each including a light-emitting region. At least one of the first, second, and third sub-pixel elements includes a light-transmitting region, where the light-emitting region includes an organic light-emitting diode light-emitting structure, and where the organic light-emitting diode light-emitting structure includes a first substrate, and a nontransparent anode, a pixel defining layer, an organic layer and a cathode, sequentially arranged above the first substrate.

Another inventive aspect is an array structure. The array structure includes a pixel element structure. The pixel element structure includes first, second, and third sub-pixel elements, each including a light-emitting region. At least one of the first, second, and third sub-pixel elements includes a light-transmitting region, where the light-emitting region includes an organic light-emitting diode light-emitting structure, and where the organic light-emitting diode light-emitting structure includes a first substrate, and a nontransparent anode, a pixel defining layer, an organic layer and a cathode, sequentially arranged above the first substrate.

Another inventive aspect is a display device. The display device includes an array structure, and the array structure includes a pixel element structure. The pixel element structure includes first, second, and third sub-pixel elements, each including a light-emitting region. At least one of the first, second, and third sub-pixel elements includes a light-transmitting region, where the light-emitting region includes an organic light-emitting diode light-emitting structure, and where the organic light-emitting diode light-emitting structure includes a first substrate, and a nontransparent anode, a pixel defining layer, an organic layer and a cathode, sequentially arranged above the first substrate.

DETAILED DESCRIPTION OF THE EMBODIMENTS

Figures 1, 2A:
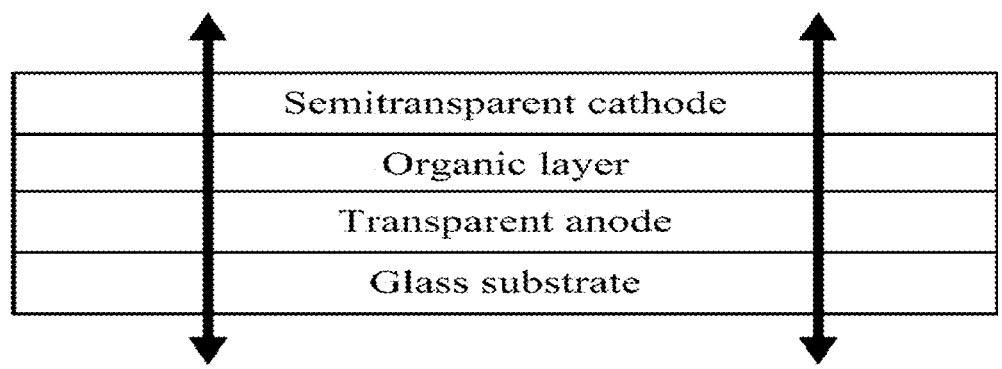
FIG. 1 is a schematic structural diagram of an OLED display device.
FIG. 2a and FIG. 2b are schematic structural diagrams of an OLED display device emitting light on both sides.
Figure 2B:
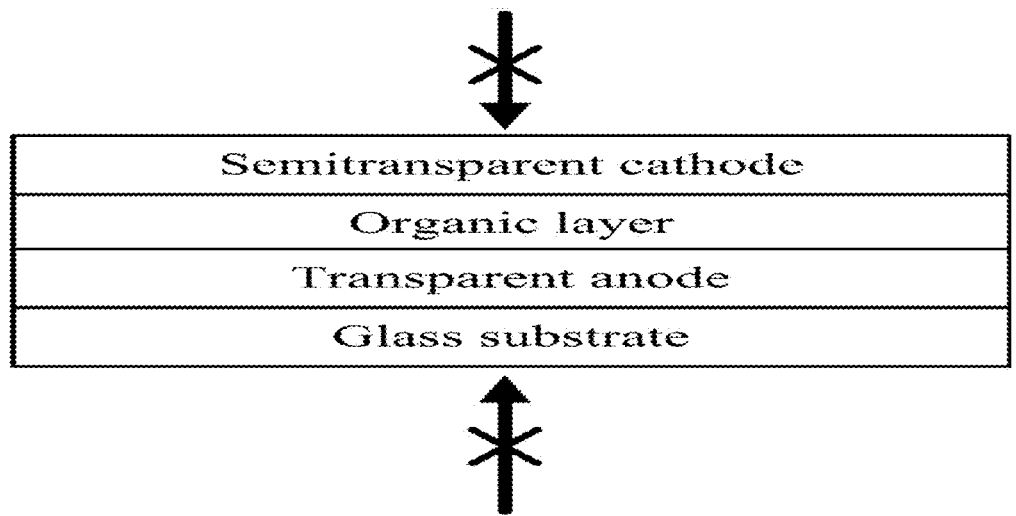

FIG. 1 illustrates a schematic structural diagram of a transparent OLED display device. A transparent OLED includes a transparent glass substrate, and a transparent anode arranged on the transparent glass substrate, a hole injection layer, a hole transmission layer, a light-emitting layer, an electronic transmission layer, an electronic injection layer and a semitransparent cathode, in that order. Referring to FIG. 2a, when the OLED is turned off, a scene on an opposite side of the OLED can be observed by an observer on either side of the OLED; and referring to FIG.

2b, when the OLED is turned on, no scene on the opposite of the OLED can be observed by the observer on either side of the OLED, and a display picture of the OLED observed by the observer on the back side of the OLED is opposite to a display picture of the OLED observed by the observer on the front side of the OLED.

In order to address the problems of high power consumption of an OLED display device emitting light on both sides and low light-emitting efficiency of the OLED display device emitting light on a single side in the prior art, an embodiment of the present invention provides a pixel element structure including a set of sub-pixel elements and a first sub-pixel element in another set of sub-pixel elements adjacent to the set of sub-pixel elements, wherein the set of sub-pixel elements includes a second sub-pixel element and a third sub-pixel element, each of the first sub-pixel element, the second sub-pixel element and the third sub-pixel element includes a light-emitting region, and any one of the first sub-pixel element, the second sub-pixel element and the third sub-pixel element includes a light-transmitting region; and the light-emitting region in each of the first sub-pixel element, the second sub-pixel element and the third sub-pixel element includes a first substrate, and a nontransparent anode, a pixel defining layer, an organic layer and a cathode, arranged above the first substrate, in that order. With the technical solution of the present invention, the nontransparent anode is used in the organic light-emitting diode light-emitting structure to thereby emit light on a single side so as to lower power consumption of an OLED display device; and the set of sub-pixel elements and the first sub-pixel element adjacent to the set of sub-pixel elements constitute a color pixel element structure, and the light-transmitting region is added to any one of the sub-pixel elements above to thereby improve effectively the transmissivity of light rays of a display panel by means of the light-transmitting region so as to achieve transparent display of the OLED display device.

Preferred embodiments of the present invention will be described below in details with reference to the drawings.

Figure 3:
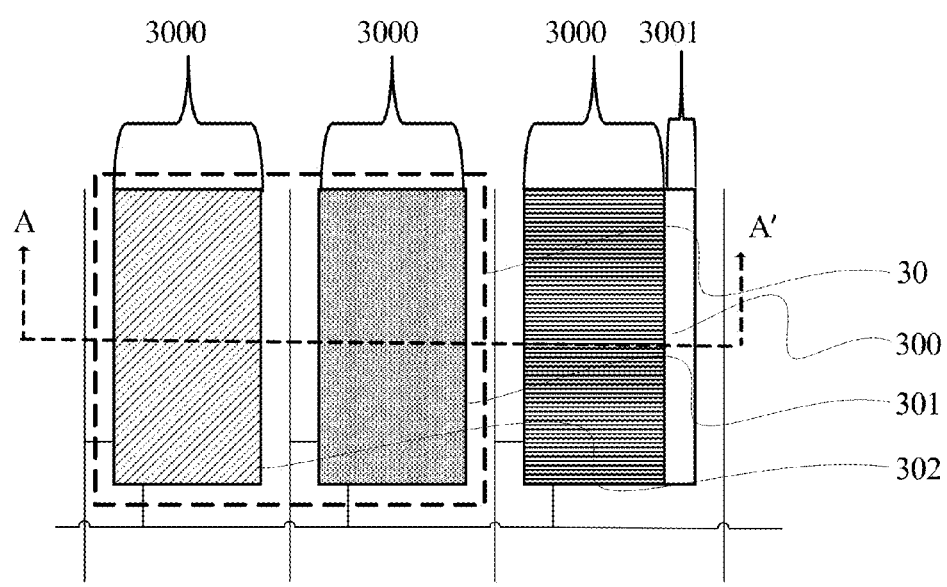
FIG. 3 is a schematic structural diagram in a top view of a pixel element structure according to an embodiment of the present invention.

FIG. 3 illustrates a schematic diagram of a pixel element structure in a top view provided by an embodiment of the present invention, as illustrated in the figure, the pixel element structure includes a set of sub-pixel elements 30 and a first sub-pixel element 300 in another set of sub-pixel elements adjacent to the set of sub-pixel elements 30, wherein the set of sub-pixel elements 30 includes a second sub-pixel element 301 and a third sub-pixel element 302, and each of the first sub-pixel element 300, the second sub-pixel element 301 and the third sub-pixel element 302 includes a light-emitting region 3000.

Figure 4:
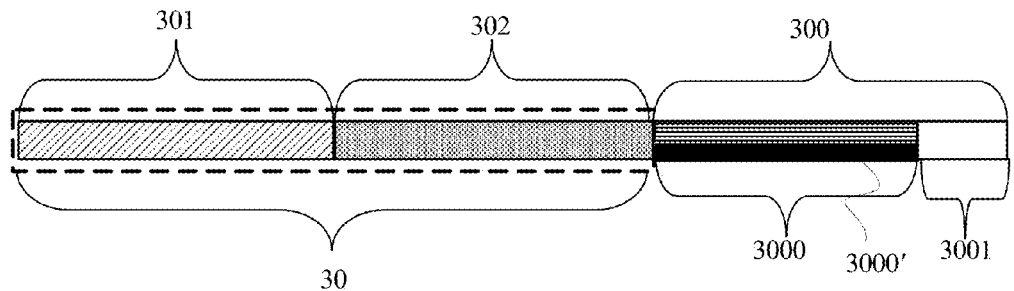
FIG. 4 is a schematic structural diagram in a sectional view of the pixel element structure illustrated in FIG. 3 according to the embodiment of the present invention.

Particularly, FIG. 4 illustrates a schematic structural diagram of the pixel element structure in a sectional view provided by the embodiment of the invention. The schematic structural sectional view of the pixel element structure in FIG. 4 is a schematic structural sectional view in the A-A' direction of the schematic structural top view of the pixel element structure illustrated in FIG. 3. As illustrated in the figure, any one of the first sub-pixel element 300, the second sub-pixel element 301 and the third sub-pixel element 302 includes a light-transmitting region 3001, wherein the light-emitting region in each of the sub-pixel elements above includes an organic light-emitting diode light-emitting structure 3000', and the area of the light-emitting region 3000 is equal to the area of the organic light-emitting diode light-emitting structure 3000' in a top view.

Figure 5:
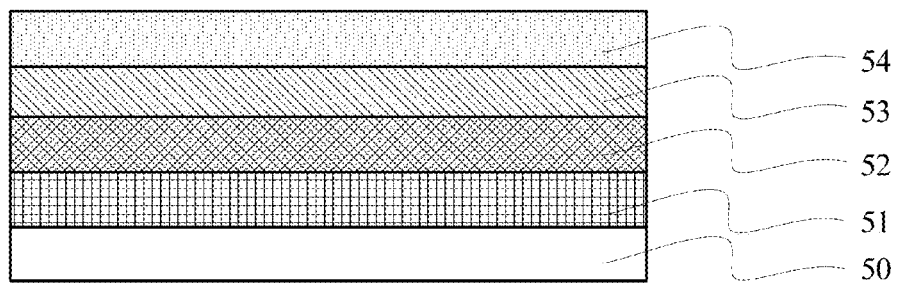
FIG. 5 is a schematic structural diagram of an organic light-emitting diode light-emitting structure according to an embodiment of the present invention.

Optionally, FIG. 5 illustrates a schematic structural diagram of the organic light-emitting diode light-emitting structure 3000' provided by an embodiment of the present invention. As illustrated in FIG. 5, the organic light-emitting diode light-emitting structure 3000' includes a first substrate 50, and a nontransparent anode 51, a pixel defining layer 52, an organic layer 53 and a cathode 54, arranged above the first substrate 50, in that order; and the light-transmitting region in each of the sub-pixel elements above is arranged as a transparent film layer structure including an insulation layer, an organic film layer, etc., to thereby improve the transmissivity of each sub-pixel element, wherein the cathode 54 above is a semitransparent cathode made of a semitransparent metal material, and the nontransparent anode above is made of ITO or ITO Ag ITO.

With the technical solution above, light can be emitted on a single side of a display device due to the nontransparent anode 51 and the top-emitting structure to thereby avoid the problems of an energy waste due to light emission on both sides and inefficient light emission; and an aperture ratio of the display device can be improved effectively by using the top-emitting structure. Moreover, when the display device is turned off, a scene on an opposite side of the display device can be observed by an observer on either side of the display device; and when the display device is turned on, a scene on the opposite side of the display device can be observed by the observer on the side where no light is emitted (on the back side), so that there will be a transparent effect regardless of whether the display device is turned on or turned off.

Optionally, the first sub-pixel element 300, the second sub-pixel element 301 and the third sub-pixel element 302 above are sub-pixel element in three different colors, and the three different colors are red, blue and green respectively, that is, the first sub-pixel element 300 above is a sub-pixel element in any one color of red, blue and green, and the second sub-pixel element 301 and the third sub-pixel element 302 above are sub-pixel elements in the other two colors than the color of first sub-pixel element 300 among the red sub-pixel element, the blue sub-pixel element and the green sub-pixel element. For example, when the first sub-pixel element 300 is a red sub-pixel element, the second sub-pixel element 301 is a blue sub-pixel element and the third sub-pixel element 302 is a green sub-pixel element, or the second sub-pixel element 301 is a green sub-pixel element and the third sub-pixel element 302 is a blue sub-pixel element; when the first sub-pixel element 300 is a blue sub-pixel element, the second sub-pixel element 301 is a red sub-pixel element and the third sub-pixel element 302 is a green sub-pixel element, or the second sub-pixel element 301 is a green sub-pixel element and the third sub-pixel element 302 is a red sub-pixel element; and when the first sub-pixel element 300 is a green sub-pixel element, the second sub-pixel element 301 is a red sub-pixel element and the third sub-pixel element 302 is a blue sub-pixel element, or the second sub-pixel element 301 is a blue sub-pixel element and the third sub-pixel element 302 is a red sub-pixel element.

Figure 6A:
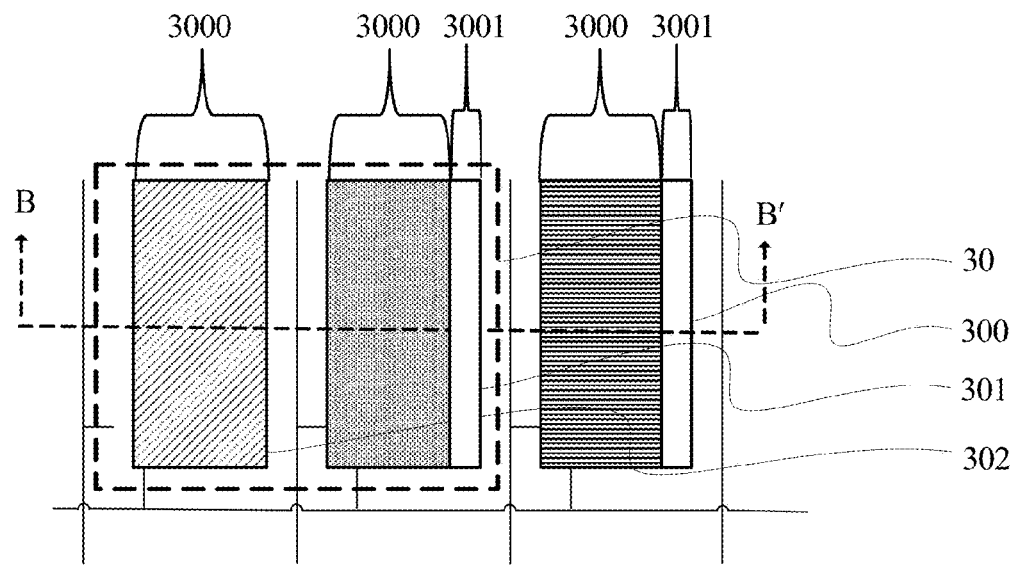
FIG. 6a is another schematic structural diagram in a top view of the pixel element structure according to the embodiment of the present invention.
Figure 6B:
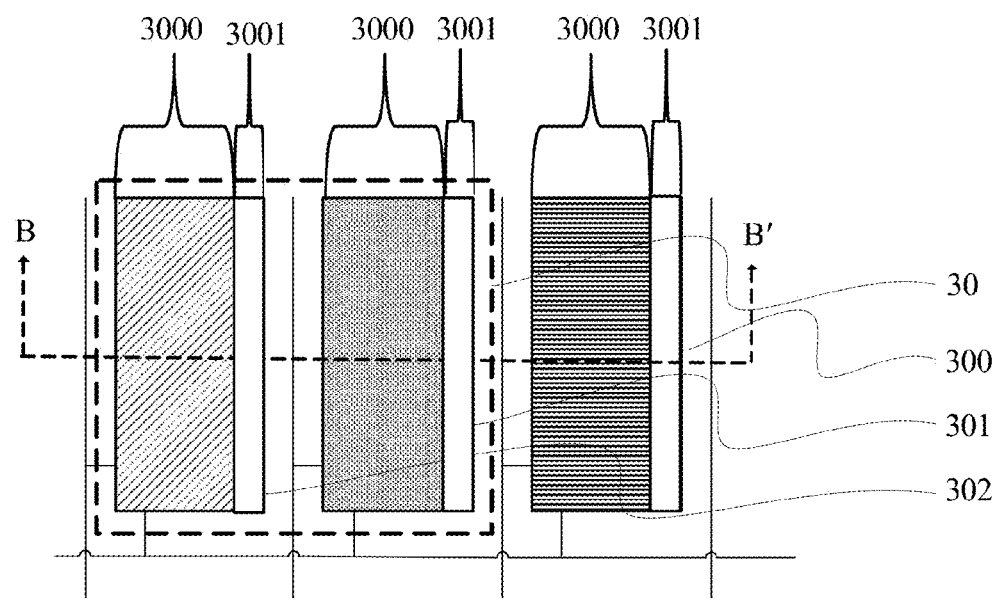
FIG. 6b is another schematic structural diagram in a top view of the pixel element structure according to the embodiment of the present invention.

In the pixel element structure illustrated in FIG. 4, only one of the three sub-pixel elements includes a light-transmitting region 3001. Optionally, in other embodiments of the present invention, any two of the three sub-pixel elements include light-transmitting regions 3001; or each of the three sub-pixel elements includes a light-transmitting region 3001. FIG. 6a and FIG. 6b illustrate schematic structural diagrams of another pixel element structure in top views provided by an embodiment of the present invention. As illustrated in FIG. 6a, the pixel element structure includes the set of sub-pixel elements 30 and the first sub-pixel element 300 adjacent to the set of sub-pixel elements 30, and the set of sub-pixel elements 30 include the second sub-pixel element 301 and the third sub-pixel element 302, wherein any two of the first sub-pixel element 300, the second sub-pixel element 301 and the third sub-pixel element 302 include a light-transmitting region 3001 each, for example, each of the first sub-pixel element and the second sub-pixel element includes a light-transmitting region 3001. As illustrated in FIG. 6b, each of the first sub-pixel element 300, the second sub-pixel element 301 and the third sub-pixel element 302 includes a light-transmitting region 3001, that is, all of the first sub-pixel element 300, the second sub-pixel element 301 and the third sub-pixel element 302 include light-transmitting regions 3001.

Figure 7A:
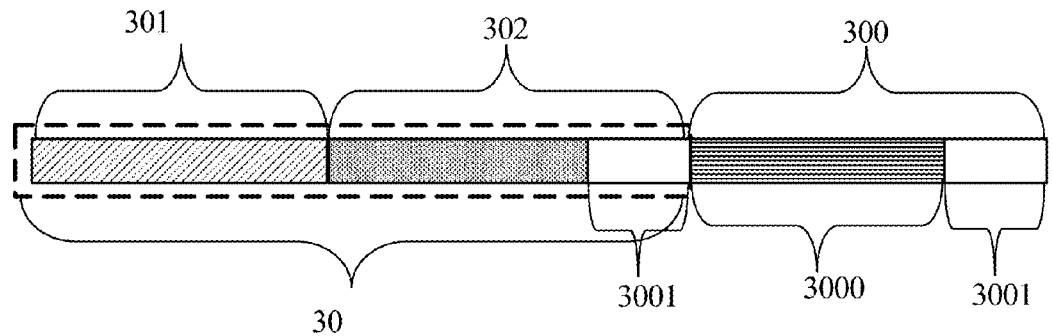
FIG. 7a is a schematic structural diagram in a sectional view of the pixel element structure illustrated in FIG. 6b according to the embodiment of the present invention.
Figure 7B:
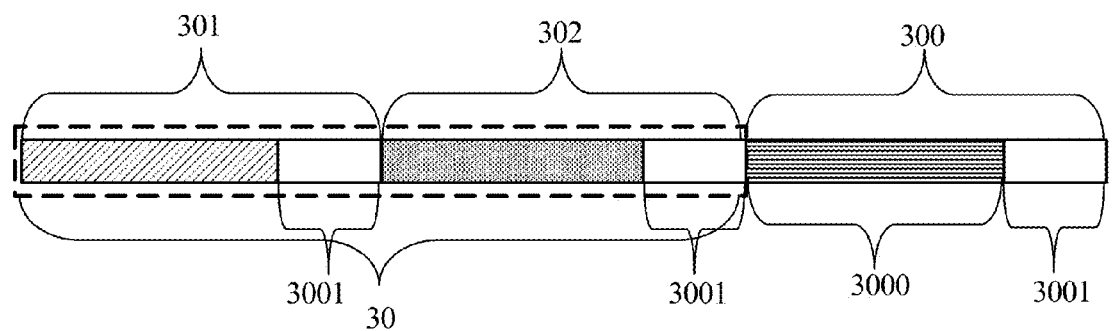
FIG. 7b is another schematic structural diagram in a sectional view of the pixel element structure according to the embodiment of the present invention.

FIG. 7a illustrates a schematic structural sectional view in the B-B' direction of the schematic structural top view of the pixel element structure illustrated in FIG. 6a according to the embodiment of the present invention; and FIG. 7b illustrates a schematic structural sectional view in the B-B' direction of the schematic structural top view of the pixel element structure illustrated in FIG. 6b according to the embodiment of the present invention.

Figure 8A:
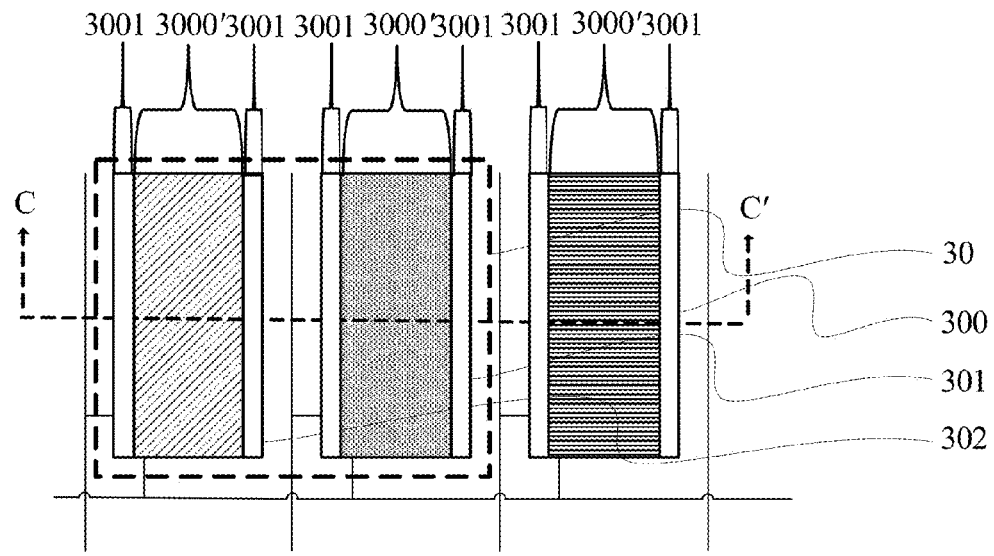
FIG. 8a is another schematic structural diagram in a top view of the pixel element structure according to the embodiment of the present invention.
Figure 8B:
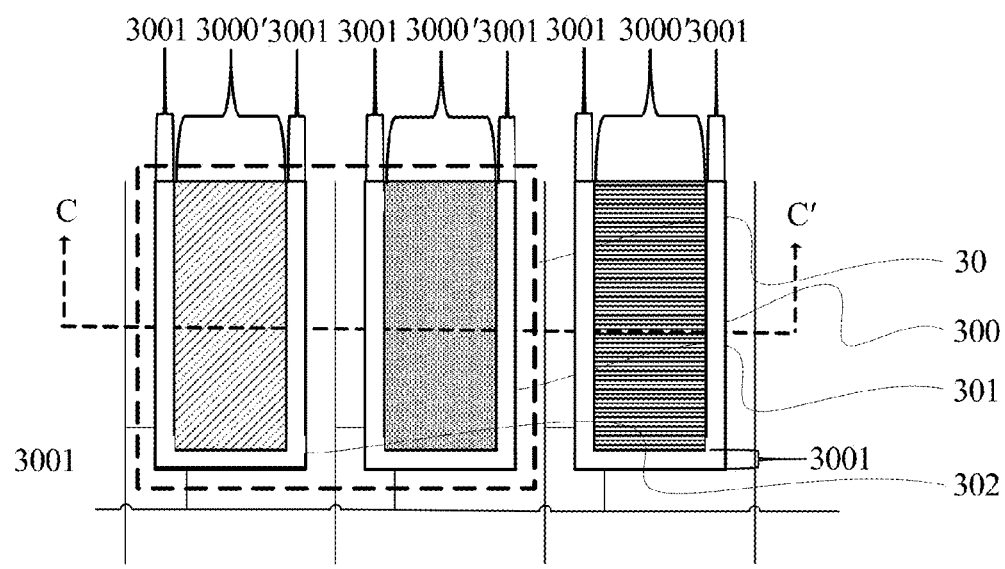
FIG. 8b is another schematic structural diagram in a top view of the pixel element structure according to the embodiment of the present invention.

Optionally, the light-transmitting regions 3001 in the sub-pixel elements above are located on at least one side of the organic light-emitting diode light-emitting structures 3000'. For example, FIG. 8a illustrates a schematic structural diagram of the pixel element structure in a top view with the light-transmitting regions 3001 located on two sides of the organic light-emitting diode light-emitting structures 3000' according to the embodiment of the present invention, wherein the light-transmitting regions 3001 are located on any two sides of the organic light-emitting diode light-emitting structures 3000'; FIG. 8b illustrates a schematic structural diagram of the pixel element structure in a top view with the light-transmitting regions 3001 located on three sides of the organic light-emitting diode light-emitting structures 3000' according to the embodiment of the present invention; and FIG. 8c illustrates a schematic structural diagram of the pixel element structure in a top view with the light-transmitting regions 3001 totally encircling the organic light-emitting diode light-emitting structures 3000' according to the embodiment of the present invention.

Figure 8C:
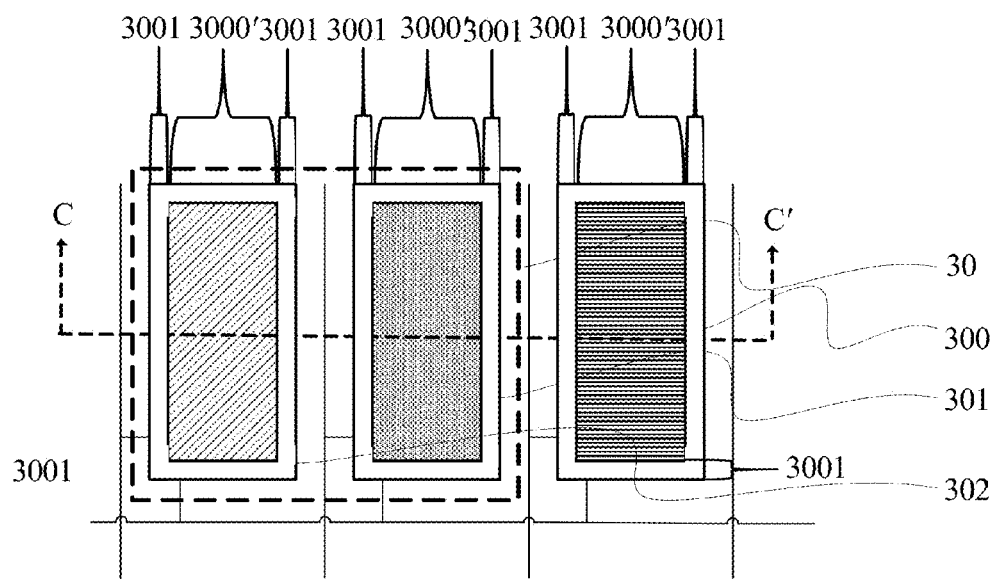
FIG. 8c is another schematic structural diagram in a top view of the pixel element structure according to the embodiment of the present invention.
Figure 9:
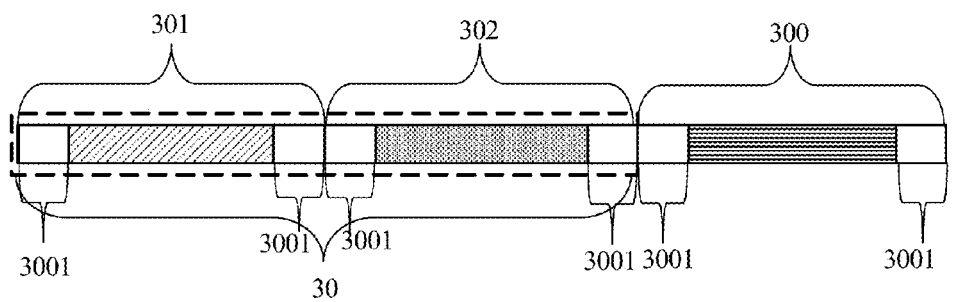
FIG. 9 is a schematic structural diagram in a sectional view of the pixel element structure illustrated in FIG. 8a according to the embodiment of the present invention.

FIG. 9 illustrates a schematic structural sectional view in the C-C' direction of the schematic structural top view of the pixel element structure illustrated in FIG. 8a, FIG. 8b and FIG. 8c according to the embodiment of the present invention. Referring to FIG. 9, all the areas of the light-transmitting regions 3001 in the first sub-pixel element 300, the second sub-pixel element 301 and the third sub-pixel element 302 above are the same, or none of the areas of the light-transmitting regions 3001 in the first sub-pixel element 300, the second sub-pixel element 301 and the third sub-pixel element 302 above is the same as any other of the areas, or the areas of the light-transmitting regions 3001 in any two of the first sub-pixel element 300, the second sub-pixel element 301 and the third sub-pixel element 302 above are the same, and the area of the light-transmitting region 3001 in the remaining sub-pixel element other than the two sub-pixel elements is different from the areas of the light-transmitting regions 3001 in the two sub-pixel elements above. With this technical solution, the arrangement of the same areas of the light-transmitting regions 3001 in the respective sub-pixel elements in the pixel element structure above can facilitate manufacturing the OLED display device including the pixel element structure as well as guaranteeing a display effect of the OLED display device and preventing linear Mura, edge Mura, etc.

Optionally all the locations of the light-transmitting regions 3001 in the first sub-pixel element 300, the second sub-pixel element 301 and the third sub-pixel element 302 above are the same, or none of the locations of the light-transmitting regions 3001 in the first sub-pixel element 300, the second sub-pixel element 301 and the third sub-pixel element 302 above is the same as any other of the locations, or the locations of the light-transmitting regions 3001 in any two of the first sub-pixel element 300, the second sub-pixel element 301 and the third sub-pixel element 302 above are the same, and the location of the light-transmitting region 3001 in the remaining sub-pixel element other than the two sub-pixel elements is different from the locations of the light-transmitting regions 3001 in the two sub-pixel elements above. Preferably all the locations of the light-transmitting regions 3001 in the respective sub-pixel elements in the pixel element structure above are the same, and with this technical solution, the arrangement of the same location of the light-transmitting regions 3001 in the respective sub-pixel elements can facilitate manufacturing the OLED display device including the pixel element structure to thereby guarantee a display effect of the OLED display device and prevent linear Mura, edge Mura, etc.

Furthermore, as illustrated in FIG. 9, in order to avoid a loss of the aperture ratio for light emission, the area of a light-emitting region in each sub-pixel element in the set of sub-pixel elements including two sub-pixel elements is the same as a total light-emitting area in a pixel element including three sub-pixel elements in an existing non-transparent display device, that is, equivalently the area or less of one sub-pixel element in the pixel element including three sub-pixel elements in the existing non-transparent display device is defined as the light-transmitting region 3001, so the area of the light-transmitting region 3001 in each sub-pixel element including the light-transmitting region 3001 is smaller than or equal to one third of the area of the sub-pixel element.

Optionally in the embodiment of the present invention, the set of sub-pixel elements can constitute an elementary color pixel element structure for full-color display together with the first sub-pixel element in the other adjacent set of sub-pixel elements, that is, with the technology of pixel rendering, any one set of sub-pixel elements 30 can display any one color together with the first sub-pixel element 300 adjacent thereto as a result of cooperation between sets of sub-pixel elements. With the technology of pixel rendering above, a display effect achieved by three sub-pixel elements can be achievable by two sub-pixel elements to thereby solve the problem of degraded pixels due to the addition of the transparent regions to a sub-pixel elements so as to ensure a display effect of the display device including the pixel element structure and facilitate an improvement in resolution of the display device.

Optionally the organic light-emitting diode light-emitting structure 3000' in each sub-pixel element of the pixel element structure above is a passive matrix top-emitting organic light-emitting diode structure; or the organic light-emitting diode light-emitting structure 3000' in each sub-pixel element of the pixel element structure above is an active matrix top-emitting organic light-emitting diode structure.

Figure 10:
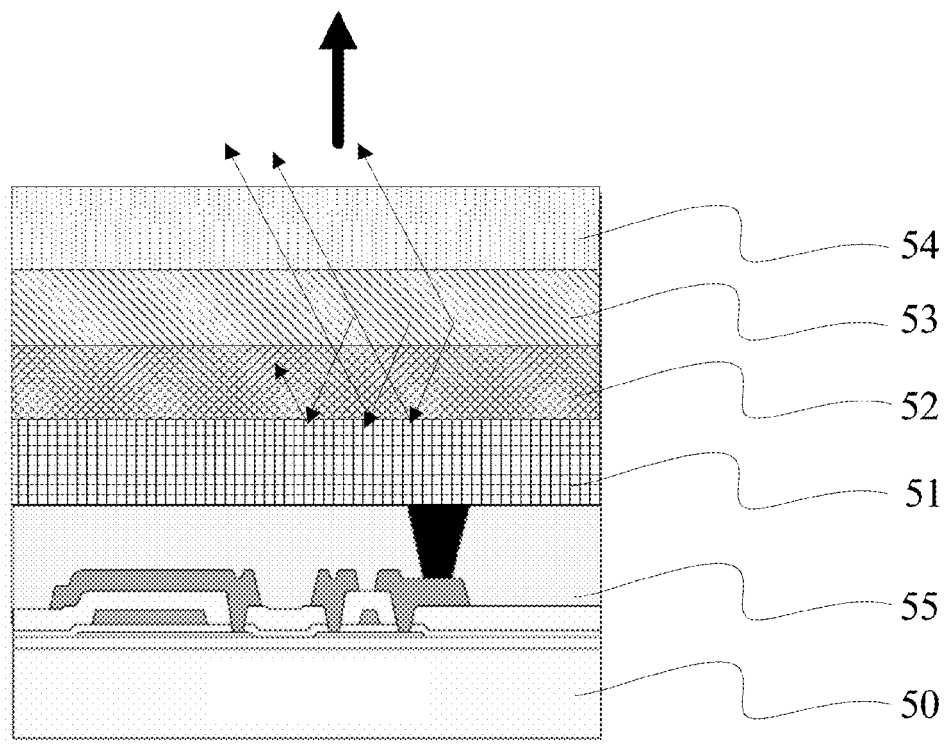
FIG. 10 is a schematic structural diagram in a sectional view of the pixel element structure illustrated in FIG. 8b according to the embodiment of the present invention.

FIG. 10 illustrates a schematic structural diagram of an active matrix top-emitting organic light-emitting diode structure, wherein the organic light-emitting diode light-emitting structure 3000' in each sub-pixel element is an active matrix top-emitting organic light-emitting diode structure according to the embodiment of the present invention. As illustrated in FIG. 10, the pixel element structure includes the organic light-emitting diode light-emitting structure 3000' and also a set of thin film transistors with or without pixel circuit compensation function, and only a drive thin film transistor 55 connected directly with the organic light-emitting diode light-emitting structure 3000' is illustrated in FIG. 10.

Figure 11:
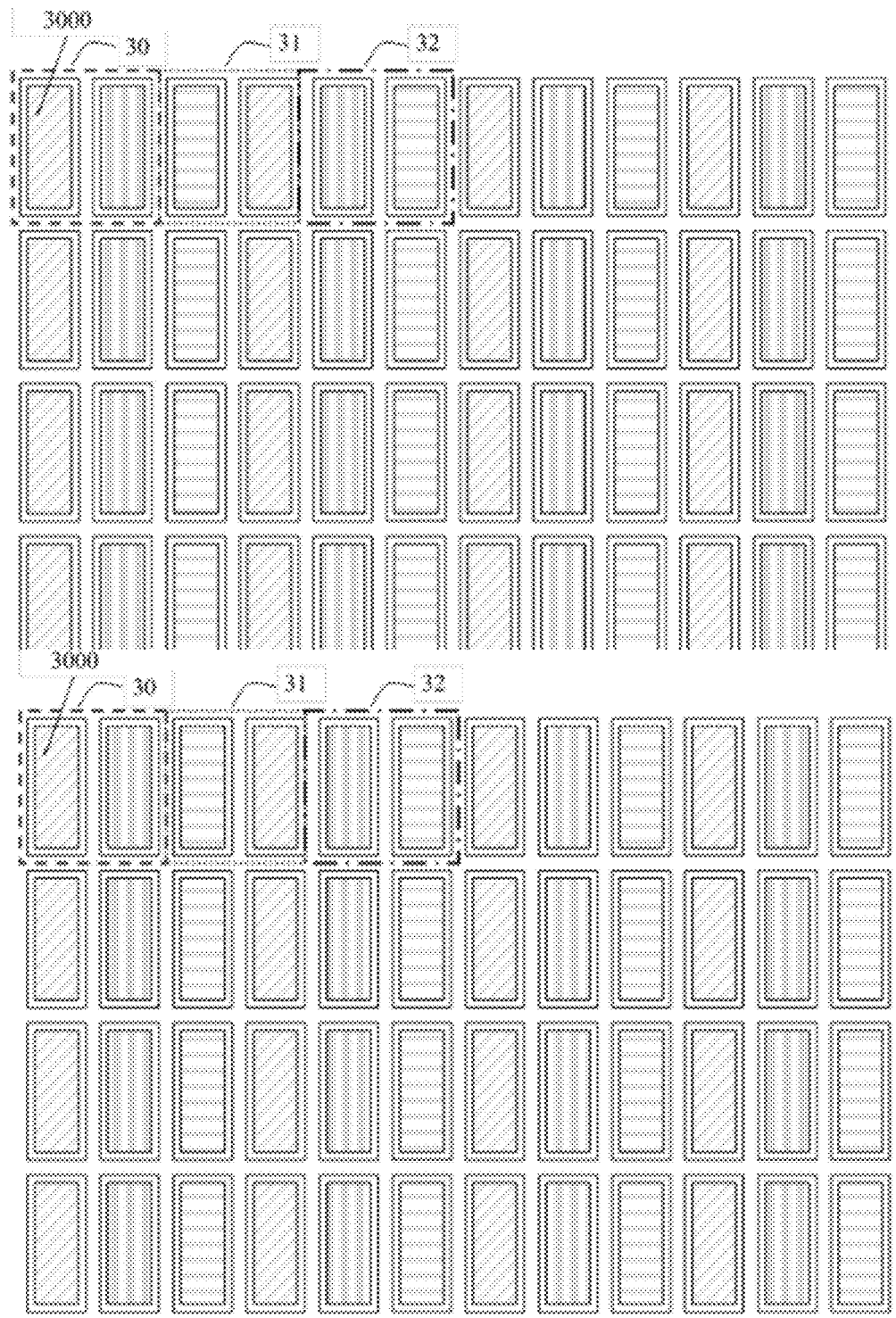
FIG. 11 is a schematic structural diagram of an array structure in a top view according to an embodiment of the present invention.

An embodiment of the present invention, referring to FIG. 11, further provides an array substructure including the pixel element structure above.

Figure 12:
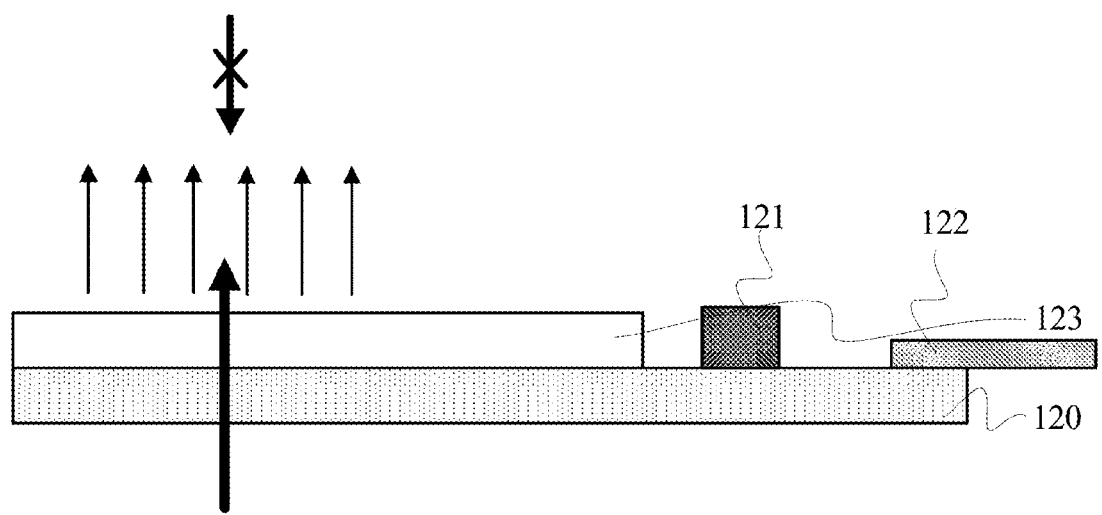
FIG. 12 is a schematic structural diagram of a display device in a section view according to an embodiment of the present invention.

An embodiment of the present invention, referring to FIG. 12a and FIG. 12b, further provides a display device including the array structure 120 above and also an IC drive circuit 121, a flexible circuit board 122 and a second substrate 12, above the array structure. As illustrated in FIG. 12a, when the display device is turned off, a scene on an opposite side of the display device can be observed by an observer on either side of the display device, and as illustrated in FIG. 12b, when the display device is turned on, a scene on the opposite side of the display device can be observed by the observer on the side where no light is emitted (on the back side), so that there will be a transparent effect regardless of whether the display device is either turned on or turned off.

In summary, an embodiment of the present invention provides a pixel element structure including a set of sub-pixel elements and a first sub-pixel element in another set of sub-pixel elements adjacent to the set of sub-pixel elements, wherein the set of sub-pixel elements includes a second sub-pixel element and a third sub-pixel element; each of the first sub-pixel element, the second sub-pixel element and the third sub-pixel element includes a light-emitting region; the second sub-pixel element or the third sub-pixel element in each set of sub-pixel elements includes a light-transmitting region; the light-emitting region includes an organic light-emitting diode light-transmitting structure; and the organic light-emitting diode light-transmitting structure includes a first substrate, and a nontransparent anode, a pixel defining layer, an organic layer and a cathode, arranged above the first substrate, in that order. With the technical solution of the present invention, the nontransparent anode is used in the organic light-emitting diode light-emitting structure to thereby emit light on a single side so as to lower power consumption of an OLED display device; and the set of sub-pixel elements and the first sub-pixel element adjacent to the set of sub-pixel elements constitute a color pixel element structure, and the light-transmitting region is added to any one of the sub-pixel elements above to thereby improve effectively the transmissivity of light rays of a display panel by means of the light-transmitting region so as to achieve transparent display of the OLED display device.

Evidently those skilled in the art can make various modifications and variations to the present invention without departing from the spirit and scope of the present invention. Thus the present invention is also intended to encompass these modifications and variations thereto so long as the modifications and variations come into the scope of the claims appended to the present invention and their equivalents.

What is claimed:

1. A pixel element structure, comprising:
    first, second, and third sub-pixel elements, each comprising a light-emitting region, wherein at least one of the first, second, and third sub-pixel elements comprises a light-transmitting region different from the light-emitting region and arranged as a transparent film layer structure comprising a transparent insulation layer and a transparent organic film layer, wherein the light-emitting region comprises an organic light-emitting diode light-emitting structure, and wherein the organic light-emitting diode light-emitting structure comprises:
        a first substrate, and
        a nontransparent anode, a pixel defining layer, an organic layer and a cathode, sequentially arranged above the first substrate,
    wherein when the pixel element structure is turned off, a scene on an opposite side of the pixel element structure is observed by an observer on either side of the pixel element structure, and
    when the pixel element structure is turned on, a scene on the opposite side of the pixel element structure is observed by the observer on a side where no light is emitted, and a scene on the opposite side of the pixel element structure is not observed by the observer on a side where the light is emitted.

2. The pixel element structure according to claim 1, wherein the first sub-pixel element is any one of a red sub-pixel element, a blue sub-pixel element, and a green sub-pixel element, and wherein the second sub-pixel element and the third sub-pixel element are each of colors different from the color of the first sub-pixel element.

3. The pixel element structure according to claim 2, wherein each of the second sub-pixel element and the third sub-pixel element comprises the light-transmitting region.

4. The pixel element structure according to claim 2, wherein the first sub-pixel element comprises the light-transmitting region.

5. The pixel element structure according to claim 1, wherein the light-transmitting region is located on at least one side of the organic light-emitting diode light-emitting structure.

6. The pixel element structure according to claim 2, wherein the light-transmitting region is located on at least one side of the organic light-emitting diode light-emitting structure.

7. The pixel element structure according to claim 3, wherein the light-transmitting region is located on at least one side of the organic light-emitting diode light-emitting structure.

8. The pixel element structure according to claim 4, wherein the light-transmitting region is located on at least one side of the organic light-emitting diode light-emitting structure.

9. The pixel element structure according to claim 1, wherein the light-transmitting region entirely encircles the organic light-emitting diode light-emitting structure.

10. The pixel element structure according to claim 2, wherein the light-transmitting region entirely encircles the organic light-emitting diode light-emitting structure.

11. The pixel element structure according to claim 3, wherein the light-transmitting region entirely encircles the organic light-emitting diode light-emitting structure.

12. The pixel element structure according to claim 4, wherein the light-transmitting region entirely encircles the organic light-emitting diode light-emitting structure.

13. The pixel element structure according to claim 1, wherein the areas of the light-transmitting regions of the first sub-pixel element, the second sub-pixel element, and the third sub-pixel element having a light-transmission region are substantially the same.

14. The pixel element structure according to claim 2, wherein the areas of the light-transmitting regions of the first sub-pixel element, the second sub-pixel element and the third sub-pixel element having a light-transmission region are substantially the same.

15. The pixel element structure according to claim 3, wherein the areas of the light-transmitting regions of the first sub-pixel element, the second sub-pixel element and the third sub-pixel element having a light-transmission region are substantially the same.

16. The pixel element structure according to claim 1, wherein the organic light-emitting diode light-emitting structure is either a passive matrix top-emitting organic light-emitting diode structure or an active matrix top-emitting organic light-emitting diode structure.

17. The pixel element structure according to claim 16, wherein the organic light-emitting diode light-emitting structure is an active matrix top-emitting organic light-emitting diode structure, and further comprises a set of thin film transistors.

18. An array structure, comprising a pixel element structure, wherein the pixel element structure comprises:
first, second, and third sub-pixel elements, each comprising a light-emitting region,
wherein at least one of the first, second, and third sub-pixel elements comprises a light-transmitting region different from the light-emitting region and arranged as a transparent film layer structure comprising a transparent insulation layer and a transparent organic film layer, wherein the light-emitting region comprises an organic light-emitting diode light-emitting structure, and wherein the organic light-emitting diode light-emitting structure comprises:
a first substrate, and
a nontransparent anode, a pixel defining layer, an organic layer and a cathode,
sequentially arranged above the first substrate,
wherein when the pixel element structure is turned off, a scene on an opposite side of the pixel element structure is observed by an observer on either side of the pixel element structure, and
when the pixel element structure is turned on, a scene on the opposite side of the pixel element structure is observed by the observer on a side where no light is emitted, and a scene on the opposite side of the pixel element structure is not observed by the observer on a side where the light is emitted.

19. A display device, comprising an array structure, wherein the array structure comprises a pixel element structure, and wherein the pixel element structure comprises:
first, second, and third sub-pixel elements, each comprising a light-emitting region, wherein at least one of the first, second, and third sub-pixel elements comprises a light-transmitting region different from the light-emitting region and arranged as a transparent film layer structure comprising a transparent insulation layer and a transparent organic film layer, wherein the light-emitting region comprises an organic light-emitting diode light-emitting structure, and wherein the organic light-emitting diode light-emitting structure comprises:
a first substrate, and
a nontransparent anode, a pixel defining layer, an organic layer and a cathode, sequentially arranged above the first substrate,
wherein when the display device is turned off, a scene on an opposite side of the display device is observed by an observer on either side of the display device, and
when the display device is turned on, a scene on the opposite side of the display device is observed by the observer on the side where no light is emitted, and a scene on the opposite side of the sub-pixel element is not observed by the observer on the side where the light is emitted.

* * * * *